United States Patent
Baek et al.

(10) Patent No.: US 8,466,052 B2
(45) Date of Patent: Jun. 18, 2013

(54) METHOD OF FABRICATING SEMICONDUCTOR DEVICE HAVING BURIED WIRING

(75) Inventors: Jong-min Baek, Suwon-si (KR);
Hee-sook Park, Hwaseong-si (KR);
Seong-hwee Cheong, Seoul (KR);
Gil-heyun Choi, Seoul (KR);
Byung-hak Lee, Hwaseong-si (KR);
Tae-ho Cha, Yongin-si (KR); Jae-hwa Park, Yongin-si (KR); Su-kyoung Kim, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 641 days.

(21) Appl. No.: 12/704,358

(22) Filed: Feb. 11, 2010

(65) Prior Publication Data
US 2010/0210105 A1    Aug. 19, 2010

(30) Foreign Application Priority Data

Feb. 17, 2009   (KR) .................. 10-2009-0012973

(51) Int. Cl.
*H01L 21/28*    (2006.01)
*H01L 21/3205*  (2006.01)
*H01L 21/321*   (2006.01)
*H01L 21/3213*  (2006.01)

(52) U.S. Cl.
USPC .... 438/589; 438/675; 438/926; 257/E21.171; 257/E21.428; 257/E21.584; 257/E21.586

(58) Field of Classification Search
USPC .......... 438/589, 270, 675, 926; 257/E21.171, 257/E21.428, E21.584, E21.586
See application file for complete search history.

(56) References Cited

U.S. PATENT DOCUMENTS

| | | | |
|---|---|---|---|
| 5,223,455 A * | 6/1993 | Itoh et al. ..................... | 438/656 |
| 6,861,701 B2 * | 3/2005 | Williams et al. ............... | 257/329 |
| 7,319,255 B2 * | 1/2008 | Hwang et al. ................. | 257/330 |
| 7,804,130 B1 * | 9/2010 | Fung ............................. | 257/330 |
| 8,101,485 B2 * | 1/2012 | Bohr ............................. | 438/275 |
| 8,153,492 B2 * | 4/2012 | Fung ............................. | 438/287 |
| 2012/0088358 A1 * | 4/2012 | Lee et al. ..................... | 438/589 |

FOREIGN PATENT DOCUMENTS

| | | |
|---|---|---|
| JP | 09-055430 | 2/1997 |
| KR | 1020050075277 A | 7/2005 |
| KR | 1020080055159 A | 6/2008 |
| KR | 1020080089060 A | 10/2008 |

* cited by examiner

*Primary Examiner* — Mary Wilczewski
(74) *Attorney, Agent, or Firm* — Myers Bigel Sibley & Sajovec, P.A.

(57) ABSTRACT

A method of fabricating a semiconductor device can include forming a trench in a semiconductor substrate, forming a first conductive layer on a bottom surface and side surfaces of the trench, and selectively forming a second conductive layer on the first conductive layer to be buried in the trench. The second conductive layer may be formed selectively on the first conductive layer by using an electroless plating method or using a metal organic chemical vapor deposition (MOCVD) or an atomic layer deposition (ALD) method.

18 Claims, 4 Drawing Sheets

METHOD OF FABRICATING SEMICONDUCTOR DEVICE HAVING BURIED WIRING

CROSS-REFERENCE TO RELATED APPLICATIONS

This application claims the benefit of Korean Patent Application No. 10-2009-0012973, filed on Feb. 17, 2009, in the Korean Intellectual Property Office, the disclosure of which is incorporated herein in its entirety by reference.

BACKGROUND

The present inventive concept relates to a method of fabricating a semiconductor device, and more particularly, to a method of fabricating a semiconductor device having buried wiring by using a selective deposition process.

Semiconductor memory devices can include a cell transistor having stack type word lines. As sizes of semiconductor memory devices are reduced, on-currents of cell transistors can decrease, and physical instability and difficulties in processes may occur due to higher aspect ratios.

A buried word line cell array transistor (BCAT) has a structure wherein a word line is buried in a trench of a semiconductor substrate, and accordingly, the cell area may be decreased. The buried word line may be formed by burying a wiring material in a trench of the semiconductor substrate and etching the wiring material using an etch-back process. When a material having a resistivity of about 100 μΩcm is used for the wiring material, the material may be difficult to be applied to dynamic random access memories (DRAMs) near the 20 nanometer level. In addition, when the wiring material is deposited on the entire surface of the substrate including the trench, a gate insulating layer may be damaged by source gas, and then, a thickness of an effective gate insulating layer, and the leakage current, may increase.

SUMMARY

A method of fabricating a semiconductor device can include forming a trench in a semiconductor substrate, forming a first conductive layer on a bottom surface and side surfaces of the trench, and selectively forming a second conductive layer on the first conductive layer to be buried in the trench.

The forming of the second conductive layer may include forming the second conductive layer selectively on the first conductive layer by using a selective deposition process.

The forming of the second conductive layer may be performed using an electroless plating method or using a metal organic chemical vapor deposition (MOCVD) or an atomic layer deposition (ALD) method.

The second conductive layer may include one of selected from the group consisting of Co, W, Mo, Pt, Rh, Ni, and mixtures thereof.

The forming of the first conductive layer may include: forming the first conductive layer on the side surfaces and the bottom surface of the trench and on the semiconductor substrate; forming a sacrificial layer on the first conductive layer so as to fill the trench; etching the first conductive layer and the sacrificial layer so that upper surfaces of the first conductive layer and the sacrificial layer do not protrude out of a surface of the semiconductor substrate from the trench; and removing the sacrificial layer.

The first conductive layer may include one of selected from the group consisting of TiN, TaN, WN, TiSiN, and mixtures thereof.

The sacrificial layer may include a TOSZ layer or a carbon-spin on hardmask (C—SOH) layer.

The etching of the sacrificial layer and the first conductive layer may include etching-back the sacrificial layer and the first conductive layer using $H_2/N_2$ chemistry.

The removing of the sacrificial layer may be performed by using an ashing process or a wet strip process.

The method may further include forming an insulating layer on the side surfaces and the bottom surface of the trench and on the semiconductor substrate before forming the first conductive layer.

DETAILED DESCRIPTION OF THE EMBODIMENTS

Figure 1:
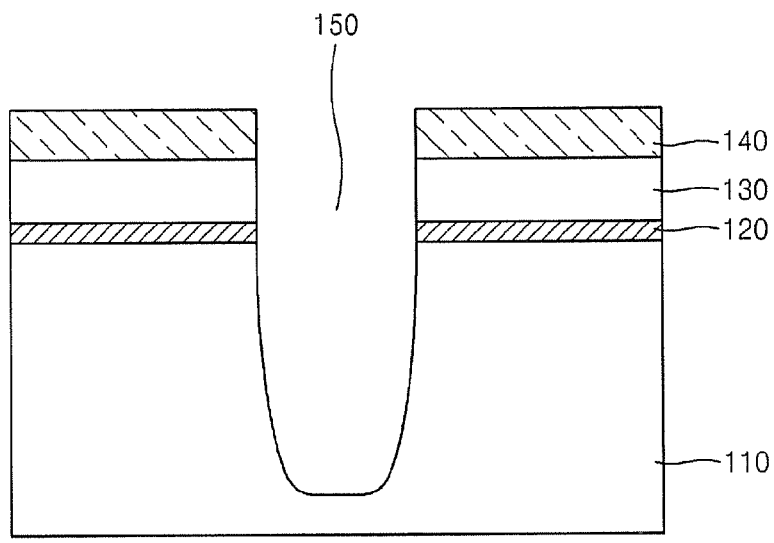
FIGS. 1 through 7 are cross-sectional views illustrating a method of forming buried wiring in a semiconductor device according to an embodiment of the present inventive concept.

While the invention is susceptible to various modifications and alternative forms, specific embodiments thereof are shown by way of example in the drawings and will herein be described in detail. It should be understood, however, that there is no intent to limit the invention to the particular forms disclosed, but on the contrary, the invention is to cover all modifications, equivalents, and alternatives falling within the spirit and scope of the invention as defined by the claims.

The present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. Like numbers refer to like elements throughout.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "lateral" or "vertical" may be used herein to describe a relationship of one element, layer or region to another element, layer or region as illustrated in the figures. It will be understood that these terms are intended to encompass different orientations of the device in addition to the orientation depicted in the figures.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this specification and the relevant art and will not be interpreted in an idealized or overly formal sense unless expressly so defined herein.

Embodiments of the invention are described herein with reference to cross-section illustrations that are schematic illustrations of idealized embodiments (and intermediate structures) of the invention. The thickness of layers and regions in the drawings may be exaggerated for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

FIGS. 1 through 7 are cross-sectional views illustrating a method of forming buried wiring of a semiconductor device according to an embodiment of the present inventive concept.

Referring to FIG. 1, a device isolation layer (not shown) that defines an active region may be formed on a semiconductor substrate 110. The device isolation layer may include a shallow trench isolation (STI) layer. A pad insulating layer 120 and a hard mask layer 140 may be sequentially formed on the semiconductor substrate 110. The pad insulating layer 120 may be an oxide layer. The hard mask layer 140 may be a nitride layer. A buffer layer 130 may further be formed between the pad insulating layer 120 and the hard mask layer 140. The buffer layer 130 may be a polysilicon layer.

A photosensitive layer (not shown) is formed on the hard mask layer 140, and then a portion of the hard mask layer 140 in which a trench will be formed is etched using the photosensitive layer as an etch mask. Then, the photosensitive layer may be removed. The buffer layer 130 and the pad insulating layer 120 may be etched using the hard mask layer 140, and then the active region of the semiconductor substrate 110 may be etched to form a trench 150.

Figure 2:
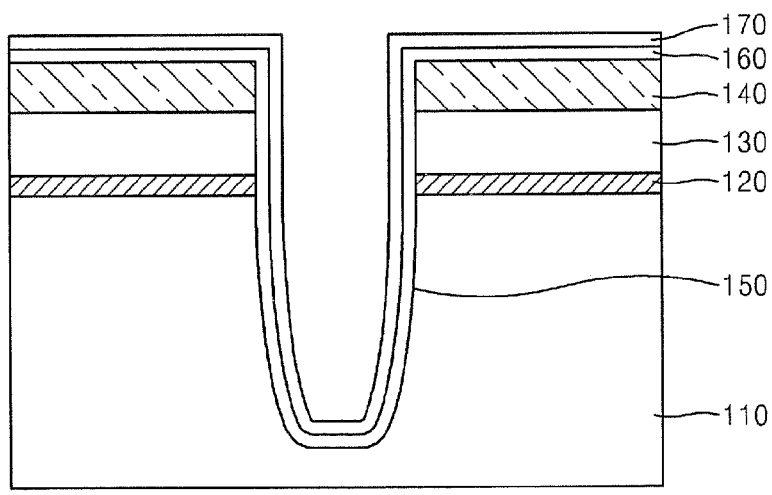

Referring to FIG. 2, a gate insulating layer 160 may be formed on a bottom surface and side surfaces of the trench 150 and on the hard mask layer 140. The gate insulating layer 160 may include at least an oxide layer. The gate insulating layer 160 may be formed by using a chemical vapor deposition (CVD) method. The gate insulating layer 160 may be formed on the bottom surface and on the side surfaces of the trench 150 through a thermal oxidation process.

A barrier layer 170 may be formed on the gate insulating layer 160. The barrier layer 170 may be framed using the CVD or an atomic layer deposition (ALD) method. The barrier layer 170 may have a thickness that is about 30% or less of the width of the trench 150. For example, the barrier layer 170 may include a metal nitride layer having a thickness of about 35 to about 60 Å for performing a barrier function and for forming a word line having low resistance. The barrier layer 170 may be formed of one selected from the group consisting of TiN, TiSiN, TaN, WN, and mixtures thereof.

Figure 3:
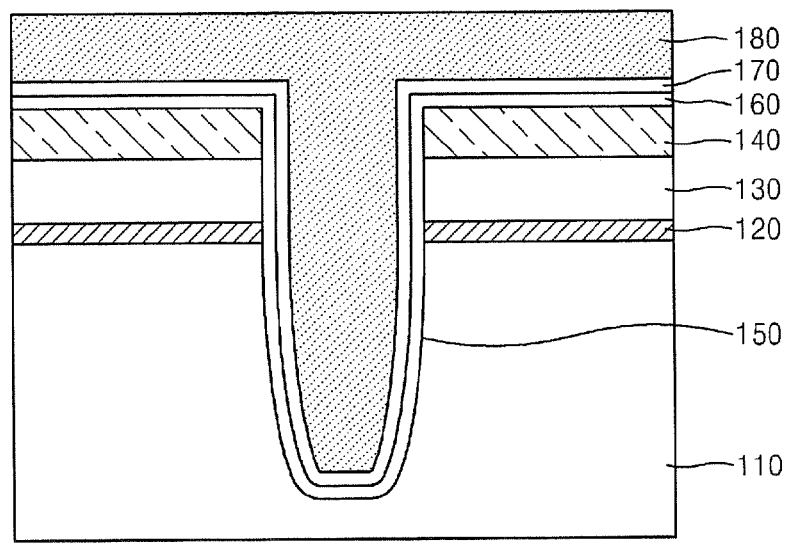

Referring to FIG. 3, a sacrificial layer 180 may be formed on the barrier layer 170 so as to fill the trench 150. The sacrificial layer 180 may include an insulating layer. The sacrificial layer 180 may include a TOSZ (product name of hydropolysilizane) layer or a carbon-spin on hardmask (C—SOH) layer.

Figure 4:
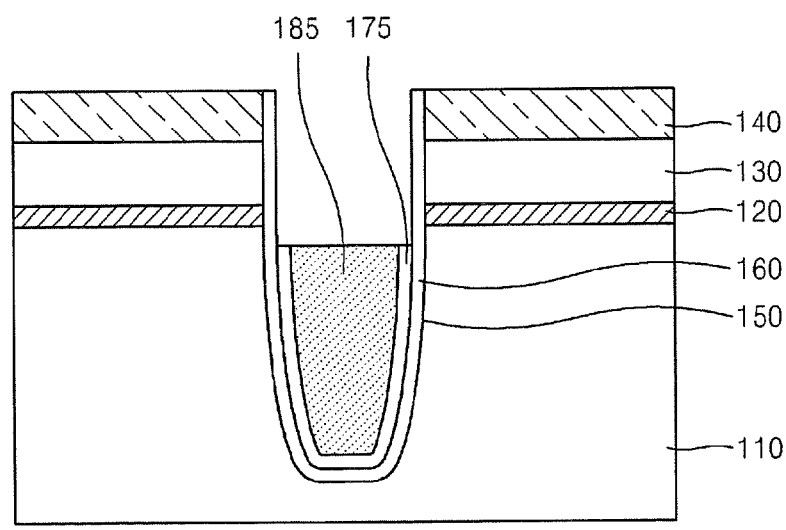

Referring to FIG. 4, the sacrificial layer 180, the barrier layer 170, and the gate insulating layer 160 may be etched-back until the hard mask layer 140 is exposed. In addition, the barrier layer 170 and the sacrificial layer 180 may be further etched so that the barrier layer 170 and a portion of the sacrificial layer 180 (185) remains only in the trench 150. The etching process may be performed using $H_2/N_2$ chemistry. A barrier layer 175 remaining in the trench 150 may be formed so that an upper surface thereof does not protrude out of the trench 150.

Figure 5:
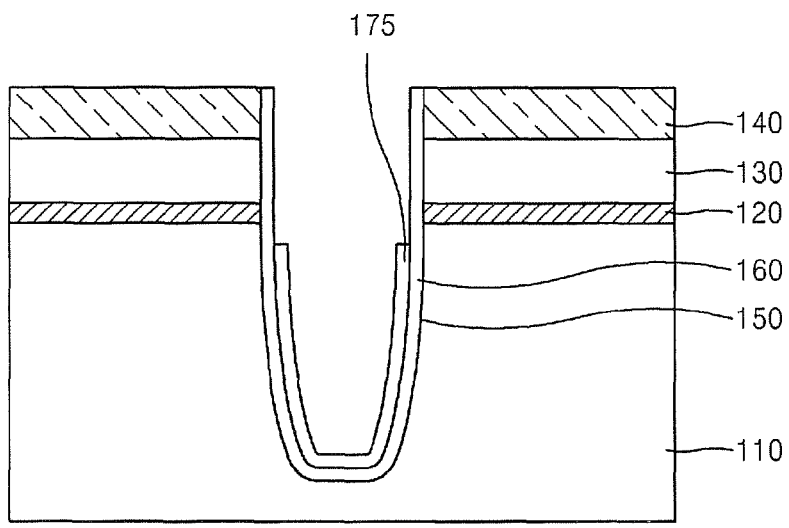

Referring to FIG. 5, a the portion of the sacrificial layer 185 remaining in the trench 150 may be removed. When the sacrificial layer 185 is a TOSZ layer, the sacrificial layer 185 may be removed by using an ashing process or a strip process using a hydrogen fluoride (HF) solution or a limulus amebocyte lysate (LAL) solution. The LAL solution may be LAL 500. When the sacrificial layer 180 is a C—SOH layer, the sacrificial layer 185 may be removed by using an ashing process.

Figure 6:
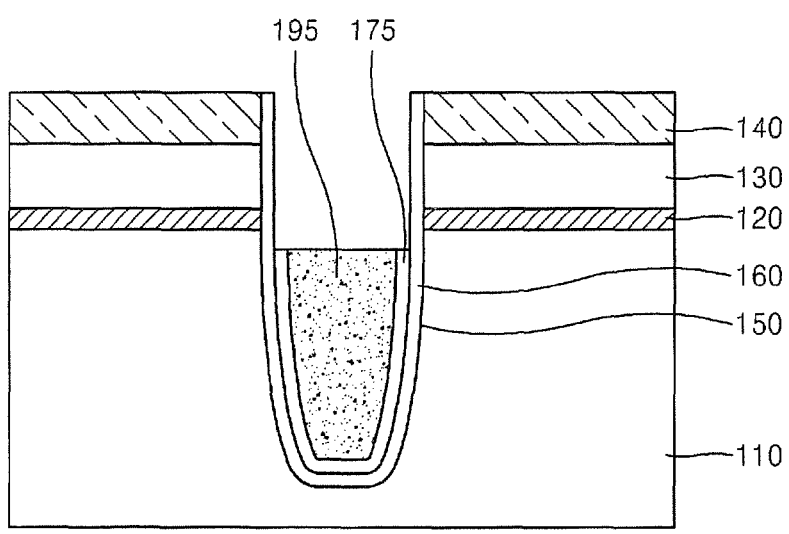

Referring to FIG. 6, a conductive layer 195 may be selectively formed on the barrier layer 175 and within the trench 150. The conductive layer 195 may be formed only on the barrier layer 175 by using an electroless plating method or a selective deposition method. The selective deposition method may include a metal organic chemical vapor deposition (MOCVD) method or an ALD method. The conductive layer 195 may include a metal material having low resistance that may be selectively formed only on the barrier layer 175, and may not be formed on the oxide layer of the pad insulating layer 120, the polysilicon layer of the buffer layer 130, and the nitride layer of the hard mask layer 140. The conductive layer 195 may include one selected from the group consisting of Co, W, Mo, Pt, Rh, and Ni, and mixtures thereof.

Figure 7:
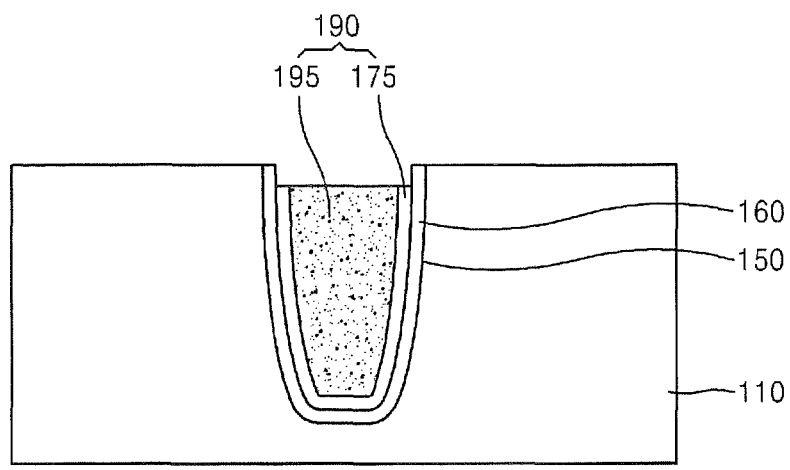

Referring to FIG. 7, the hard mask layer 140, the buffer layer 130, and the pad insulating layer 120 remaining on the semiconductor substrate 110 may be removed. Accordingly, a word line 190 buried in the trench 150 may be formed in including the barrier layer 175 and the conductive layer 195 on the barrier layer 175. As shown in FIG. 7, the conductive layer 195 may be recessed along the side walls of the trench 150 to beneath an upper edge of the gate insulating layer 160.

A capping layer (not shown) may further be formed on the semiconductor layer 110 so as to cover the word line 190. The capping layer may include an insulating layer such as an oxide layer or a nitride layer.

Figure 8:
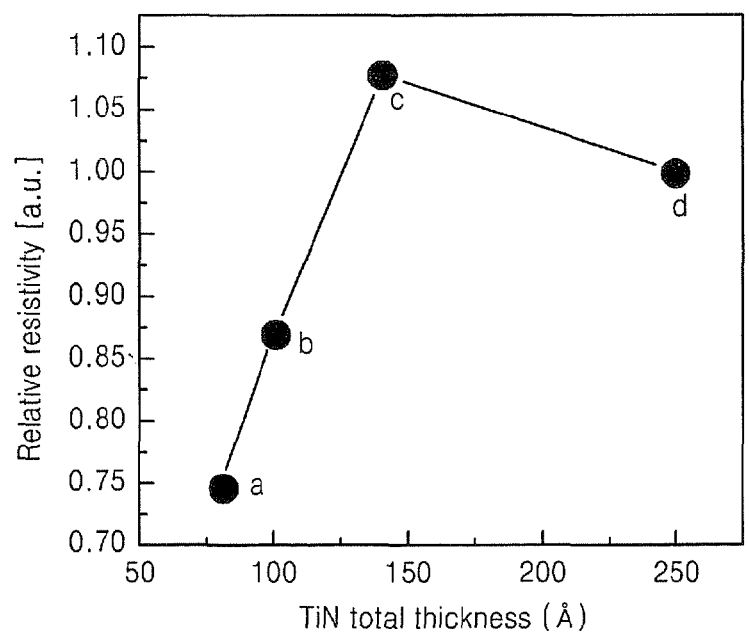
FIG. 8 is a graph showing a resistance value of the wiring according to thickness of a barrier layer and a wiring material of the buried wiring.

FIG. 8 is a graph showing a resistance value of the buried word line according to the total thickness of the word line having the barrier layer including TiN and the low-resistive metal layer according to the present embodiment. In FIG. 8, point "a" denotes a resistance value of the word line when the thickness of the barrier layer is 40 Å (total thickness of the word line in the trench is 80 Å), and point "b" denotes a resistance value of the word line when the thickness of the barrier layer is 50 Å (total thickness of the word line in the trench is 100 Å). Also, point "c" denotes a resistance value of the word line when the thickness of the barrier layer is 70 Å (total thickness of the word line in the trench is 140 Å), and point "d" denotes a resistance value of the word line when the word line only includes a TiN layer.

As the ratio of the thickness of TiN layer with respect to the line width of the word line is reduced, the resistance decreases, and thus the resistance value of the word line is much smaller than that of the case where the word line is formed of only TiN layer.

The method of forming the conductive layer in the trench by using the selective deposition process may be applied to forming of wiring such as buried bit lines.

While the inventive concept has been particularly shown and described with reference to exemplary embodiments thereof, it will be understood that various changes in form and details may be made therein without departing from the spirit and scope of the following claims.

What is claimed is:

1. A method of fabricating a semiconductor device having buried wiring, the method comprising:
   forming a trench in a semiconductor substrate;
   forming a first conductive layer on a bottom surface and side surfaces of the trench; and
   selectively forming a second conductive layer on the first conductive layer to be buried in the trench, wherein the forming of the first conductive layer comprises:
   forming the first conductive layer on the side surfaces and the bottom surface of the trench and on the semiconductor substrate;
   forming a sacrificial layer on the first conductive layer to fill the trench;
   etching the first conductive layer and the sacrificial layer so that upper surfaces of the first conductive layer and the sacrificial layer are recessed from the surface of the semiconductor substrate into the trench; and
   removing the sacrificial layer.

2. The method of claim 1, wherein selectively forming the second conductive layer comprises forming the second conductive layer selectively on the first conductive layer by using a selective deposition process.

3. The method of claim 2, wherein forming the second conductive layer comprises electroless plating or metal organic chemical vapor deposition (MOCVD) or atomic layer deposition (ALD) method.

4. The method of claim 2, wherein the second conductive layer includes one selected from the group consisting of Co, W, Mo, Pt, Rh, Ni, and mixtures thereof.

5. The method of claim 1, wherein the first conductive layer includes one of selected from the group consisting of TiN, TaN, WN, TiSiN, and mixtures thereof.

6. The method of claim 1, wherein the sacrificial layer includes a TOSZ layer or a carbon-spin on hardmask (C—SOH) layer.

7. The method of claim 6, wherein etching the sacrificial layer and the first conductive layer comprises etching-back the sacrificial layer and the first conductive layer using $H_2/N_2$ chemistry.

8. The method of claim 6, wherein removing the sacrificial layer is performed by using an ashing process or a wet strip process.

9. The method of claim 1, further comprising forming an insulating layer on the side surfaces and the bottom surface of the trench and on the semiconductor substrate before forming the first conductive layer.

10. A method of fabricating a semiconductor device having buried wiring, the method comprising:
    forming a trench in a semiconductor substrate;
    forming a gate insulating layer in the trench and on the side surfaces thereof so that an upper edge of the gate insulating layer is recessed beneath an opening of the trench;
    forming a first conductive layer on a bottom surface and side surfaces of the trench; and
    selectively forming a second conductive layer on the first conductive layer so that upper edges of the first and second conductive layers are recessed within the trench beneath the upper edge of the gate insulating layer.

11. The method of claim 10, wherein selectively forming the second conductive layer comprises forming the second conductive layer selectively on the first conductive layer by using a selective deposition process.

12. The method of claim 11, wherein the forming the second conductive layer comprises electroless plating or metal organic chemical vapor deposition (MOCVD) or atomic layer deposition (ALD) method.

13. The method of claim 11, wherein the second conductive layer includes one selected from the group consisting of Co, W, Mo, Pt, Rh, Ni, and mixtures thereof.

14. The method of claim 10, wherein forming the first conductive layer comprises:
    forming a sacrificial layer on the first conductive layer to fill the trench; and
    etching the first conductive layer and the sacrificial layer so that the upper edges are recessed within the trench.

15. The method of claim 14, wherein the first conductive layer includes one of selected from the group consisting of TiN, TaN, WN, TiSiN, and mixtures thereof.

16. The method of claim 14, wherein the sacrificial layer includes a TOSZ layer or a carbon-spin on hardmask (C—SOH) layer.

17. The method of claim 16, wherein etching the sacrificial layer and the first conductive layer comprises etching-back the sacrificial layer and the first conductive layer using $H_2/N_2$ chemistry.

18. The method of claim 10, wherein forming the gate insulating layer comprises forming the gate insulating layer before forming the first conductive layer.

* * * * *